(12) United States Patent  (10) Patent No.: US 7,544,594 B2
Change  (45) Date of Patent: Jun. 9, 2009

(54) METHOD OF FORMING A TRANSISTOR HAVING GATE PROTECTION AND TRANSISTOR FORMED ACCORDING TO THE METHOD

(75) Inventor: Peter L. D. Change, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 276 days.

(21) Appl. No.: 11/478,251

(22) Filed: Jun. 28, 2006

(65) Prior Publication Data

US 2008/0001236 A1 Jan. 3, 2008

(51) Int. Cl.
*H01L 21/00* (2006.01)
(52) U.S. Cl. ............. 438/585; 438/595; 257/E21.176
(58) Field of Classification Search ......... 438/585–595; 257/E21.176
See application file for complete search history.

(56) References Cited

U.S. PATENT DOCUMENTS

| | | | |
|---|---|---|---|
| 4,906,589 A | 3/1990 | Chao | |
| 5,346,839 A | 9/1994 | Sundaresan | |
| 5,466,621 A | 11/1995 | Hisamoto et al. | |
| 5,578,513 A | 11/1996 | Maegawa | |
| 5,658,806 A | 8/1997 | Lin et al. | |
| 5,701,016 A | 12/1997 | Burroughes et al. | |
| 5,716,879 A | 2/1998 | Choi et al. | |
| 5,827,769 A | 10/1998 | Aminzadeh et al. | |
| 6,022,815 A | 2/2000 | Doyle et al. | |
| 6,057,604 A | 5/2000 | Nguyen | |
| 6,207,514 B1 | 3/2001 | Furukawa et al. | |
| 6,228,691 B1 | 5/2001 | Doyle | |
| 6,483,156 B1 | 11/2002 | Adkisson et al. | |
| 6,680,240 B1 | 1/2004 | Maszara | |
| 6,696,345 B2 | 2/2004 | Chau et al. | |
| 6,713,396 B2 | 3/2004 | Anthony | |
| 6,716,684 B1 | 4/2004 | Krivokapic et al. | |
| 6,716,690 B1 | 4/2004 | Wang et al. | |
| 6,858,478 B2 | 2/2005 | Chau et al. | |
| 6,858,483 B2 | 2/2005 | Doczy et al. | |
| 6,914,295 B2 | 7/2005 | Chau et al. | |

(Continued)

FOREIGN PATENT DOCUMENTS

KR 10-1998-0079122 A 11/1998

(Continued)

OTHER PUBLICATIONS

International Search Report and Written Opinion of the Searching Authority: Dated Nov. 21, 2007;PCT/US2007/072167, 10 pgs.

(Continued)

*Primary Examiner*—Richard A. Booth
(74) *Attorney, Agent, or Firm*—Scott M. Lane

(57) ABSTRACT

A microelectronic device and a method of forming same. The method comprises: a transistor gate; a first spacer and a second spacer respectively adjacent a first side and a second side of the gate; a diffusion layer supra-adjacent the gate; contact regions super-adjacent the diffusion layer and adjacent the first spacer and the second spacer; a protective cap super-adjacent the gate and between the contact regions, the protective cap being adapted to protect the device from shorts between the gate and the contact regions.

19 Claims, 8 Drawing Sheets

U.S. PATENT DOCUMENTS

| | | |
|---|---|---|
| 7,005,366 B2 | 2/2006 | Chau et al. |
| 2002/0011612 A1 | 1/2002 | Hieda |
| 2003/0057486 A1 | 3/2003 | Gambino et al. |
| 2003/0129795 A1 | 7/2003 | Chau et al. |
| 2004/0036126 A1 | 2/2004 | Chau et al. |
| 2004/0092062 A1 | 5/2004 | Ahmed et al. |
| 2004/0094807 A1 | 5/2004 | Chau et al. |
| 2004/0110097 A1 | 6/2004 | Ahmed et al. |
| 2004/0155011 A1 | 8/2004 | Hareland et al. |
| 2004/0214385 A1 | 10/2004 | Doczy et al. |
| 2004/0241916 A1 | 12/2004 | Chau et al. |
| 2005/0040469 A1* | 2/2005 | Doczy et al. ............ 257/369 |
| 2005/0156171 A1 | 7/2005 | Brask et al. |

FOREIGN PATENT DOCUMENTS

| | | |
|---|---|---|
| KR | 10-2004-0054363 A | 6/2004 |

OTHER PUBLICATIONS

T. Miyashita, et al., "A Novel Bit-line Process using Poly-Si Masked Dual-Damascene (PMDD) for 0.13μm DRAMs and Beyond", IEEE, pp. 15.4.1 to 15.4.4 (2000).

H. Koga, et al., "A 0.23μm$^2$ Double Seld-Aligned Contact Cell for Gigabit DRAMs with a Ge-Added Vertical Epitaxial Si Pad," IEEE, pp. 22.1.1 to 22.1.4 (1996).

* cited by examiner

METHOD OF FORMING A TRANSISTOR HAVING GATE PROTECTION AND TRANSISTOR FORMED ACCORDING TO THE METHOD

FIELD OF THE INVENTION

Embodiments of the present invention relate generally to microelectronic layout and fabrication. In particular, embodiments relate to gate protection for transistors and to methods of achieving such gate protection.

BACKGROUND OF THE INVENTION

The ongoing scaling of transistors presents an ever expanding array of new issues to be overcome as the transistor dimensions shrink. Once such issue concerns a protection of the transistor gate from shorting with respect to the transistor contacts.

Gate protection according to the prior art may be achieved using a gate recess followed by a silicon nitride fill and planarization. Referring for example to FIGS. 1a and 1b, a prior art transistor fabrication contemplating gate protection typically involves a recessing of the transistor gates followed by a silicon nitride fill. Thus, as seen in FIG. 1a, a transitional transistor structure 100 has been provided with recessed gates 102 including recesses 104 defined between spacers 105. By "transitional gate structure," what is meant in the context of the instant description if a transistor structure including a transistor gate where a fabrication of the transistor device has not yet come to completion. In the case of the shown structure of FIGS. 1a and 1b, contact regions for example have not yet been provided. The structure 100 further includes, as would be readily recognizable by the skilled person, a buried oxide layer 106 and an ILD oxide layer 108 on the buried oxide layer. A diffusion layer 110 supports the transistor gates and the spacers thereon. The diffusion layer 110, gates 102 and spacers 105 form transistor structure 112. the gate recess etch may be done with a selective etch. For example, aluminum gates could be etched using a chlorine dry etch without attacking the silicon oxide of ILD oxide layer 108. If the gate metals are different, then a different dry etch can be used or a combination of dry and wet etch can be used, especially to remove metals completely in the recess regions 104. Referring next to FIG. 1b, the deposition of silicon nitride (SiN) in recess regions 104 forms caps 114 over gates 102. After SiN deposition, a self aligned contact etch followed by contact metal deposition and planarization may be formed to form self aligned contact areas in a well known manner. Thereafter, a layer of contact metal may be deposited onto the self aligned contact areas, and planarized by being polished or etched to form contact regions. The prior art additionally discloses provided a metal one layer directly onto the diffusion layer without the use of self-aligned contact regions.

Disadvantageously, as gate lengths are scaled down, gate protection through the provision of capped gate recess regions has sometimes presented challenges, at least in view of the difficulty in controlling the gate's vertical dimension. A recessing of the gate and a planarization of the SiN cap reduces gate height in the prior art, resulting among other things in diminishing process margins.

Figure 1A:
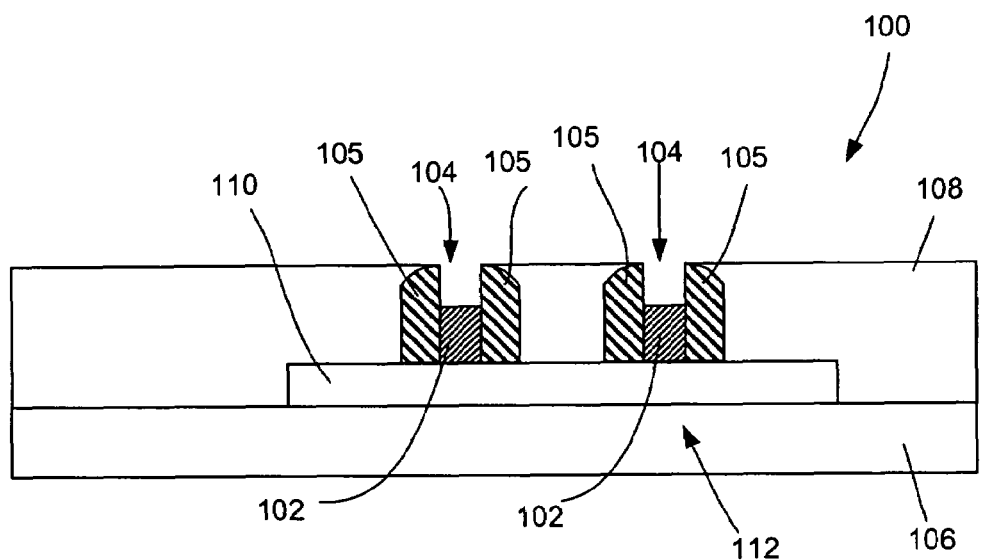
FIGS. 1a and 1b are cross-sectional, schematic views of transitional transistor structures according to the prior art including gate protection.
Figure 1B:
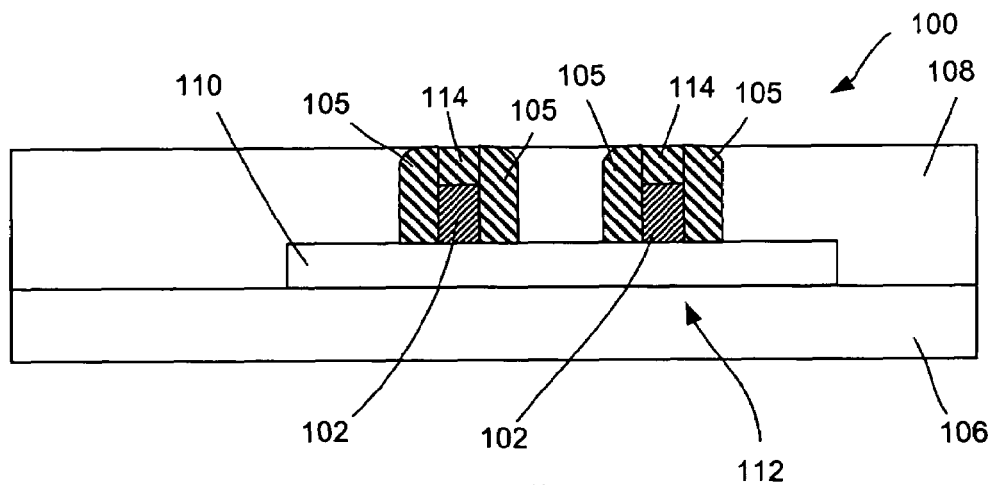

For simplicity and clarity of illustration, elements in the drawings have not necessarily been drawn to scale. For example, the dimensions of some of the elements may be exaggerated relative to other elements for clarity. Where considered appropriate, reference numerals have been repeated among the drawings to indicate corresponding or analogous elements.

DETAILED DESCRIPTION

In the following detailed description, embodiments of a microelectronic device, a method of forming the device and a system incorporating the device are disclosed. Reference is made to the accompanying drawings within which are shown, by way of illustration, specific embodiments by which the present invention may be practiced. It is to be understood that other embodiments may exist and that other structural changes may be made without departing from the scope and spirit of the present invention.

The terms on, above, below as used herein refer to the position of one element relative to other elements. As such, a first element disposed on, above, or below a second element may be directly in contact with the second element or it may include one or more intervening elements. However, as used herein, a first element described as being disposed adjacent a second element, including super-adjacent (adjacent and above) or supra-adjacent (adjacent and below) the second element, is in contact with the second element. In addition, in the instant description, an alternative designation between a first element A and a second element B is referred to as "A/B." Thus, a reference to FIG. 2 or FIG. 3, for instance, is referred to as FIG. 2/FIG. 3.

Figure 2:
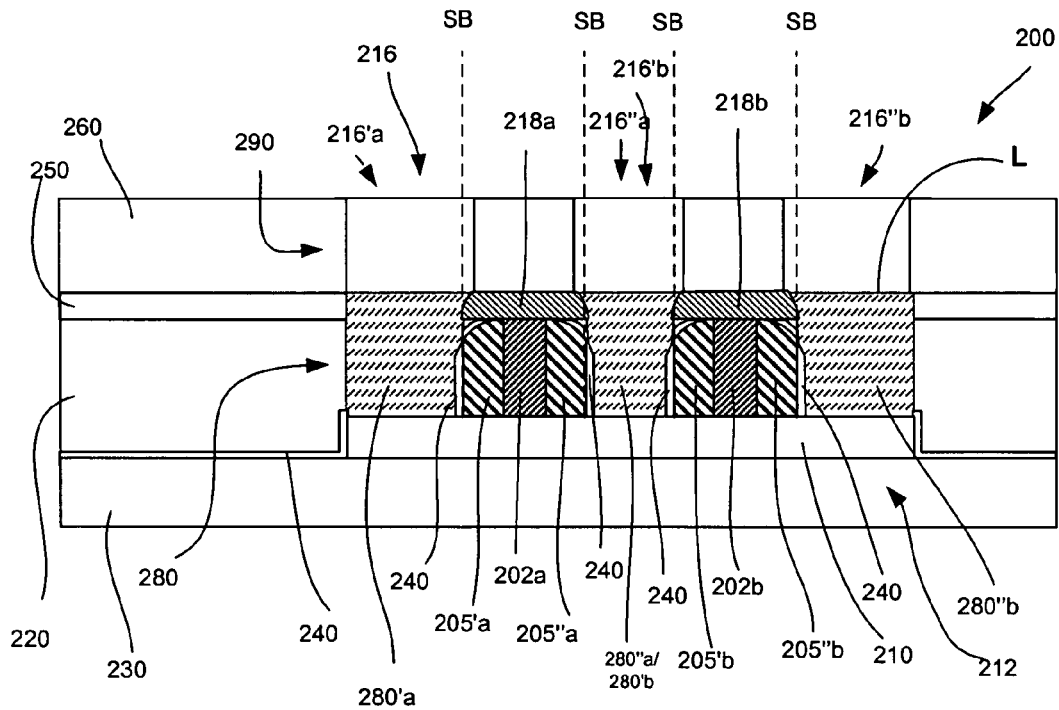
FIG. 2 is a cross-sectional view of a microelectronic device formed according to a first embodiment.
Figure 3:
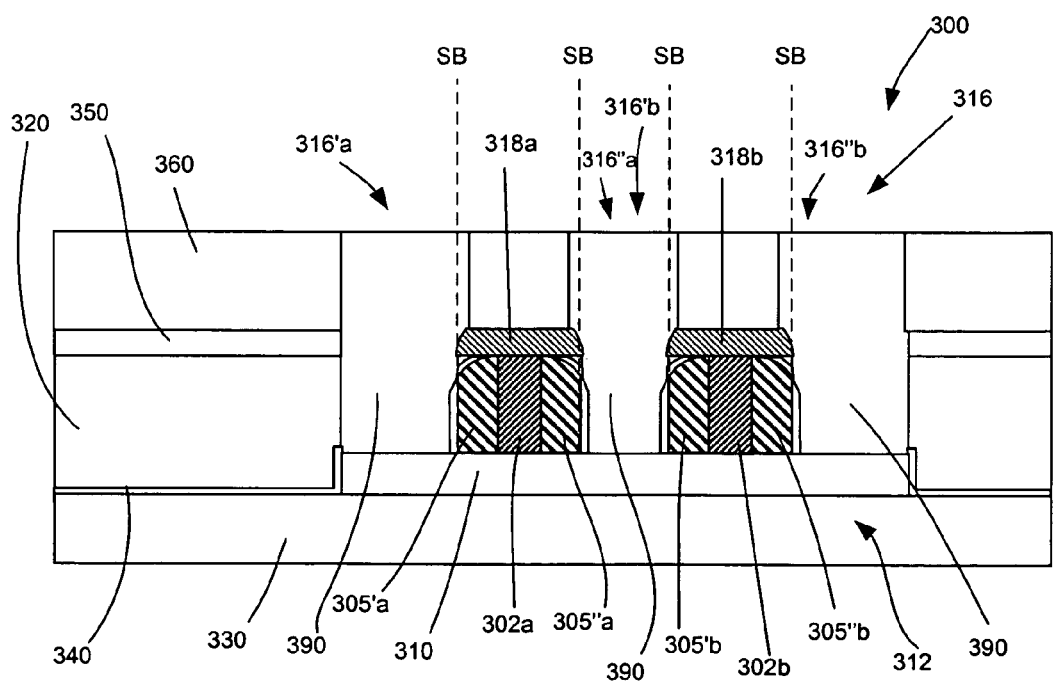
FIG. 3 is a cross-sectional view of microelectronic device formed according to a second embodiment.

Referring first to FIGS. 2 and 3, two embodiments of a microelectronic device including transistors according to the invention are depicted in cross-section for a silicon-on insulator (SOI) substrate, although embodiments comprise within their scope transistors on bulk substrates. Additionally, although FIGS. 2 and 3 show a transistor structure including a pair of gates, embodiments are not so limited, and include within their scope a transistor structure including one or more gates. While FIG. 2 shows a microelectronic device including self-aligned contact regions supra-adjacent metal one portions, FIG. 3 shows a microelectronic device that does not include self-aligned contact regions, but rather metal one portions that extend down to the diffusion layer of the device.

Referring now to FIG. 2, microelectronic device 200 comprises a transistor structure 212 including gates, spacers and a diffusion layer as will be further described below. Transistor structure 212 may thus include a pair of gates 202a and 202b disposed next to one another. Transistor structure 212 further includes a first spacer 205'a and a second spacer 205"a respectively adjacent a first side and a second side of the gate 202a. In addition, transistor structure 212 includes a first spacer 205'b and a second spacer 205'b respectively adjacent a first side and a second side of the gate 202b. Transistor structure 212 may additionally include a diffusion layer 210 supra-adjacent the pair of gates. The diffusion layer 210 may include a source region between the two gates, and drain regions on opposite sides of the gates (not designated in the figures). Microelectronic device 200 may further include contact regions 216 super-adjacent the diffusion layer 210. Diffusion layer 210, also called a diffusion body or fin, may include source and drain regions as mentioned above (not designated in the figures). The contact regions 216 may be disposed adjacent the first spacer and the second spacer of each gate as shown. The contact regions may further be disposed adjacent protective caps 218a and 218b, which caps are respectively disposed super-adjacent the gates 202a on the one hand, and 202b on the other hand. The protective caps 218a and 218b are adapted to protect the device from shorts between the gate and the contact regions. As such, the protective caps may comprise a material adapted to protect the gate from the contacts, and also a material that is selectively resistant to an oxide etch in order to withstand an etch of the ILD layers down to the diffusion layer. As such, the protective caps may, for example, comprise silicon nitride. According to one embodiment, a lateral extension of the cap beyond the gate may be dictated by a thickness of the spacers as a target thickness in achieving protection from interaction between the gates and the contact regions. A thickness of the cap itself may be chosen taking into account the relative etch rates of the ILD layer 250 and of the cap material, and, in addition the thickness of the etch stop layers 240. Thus, a thickness of the cap may be chosen such that the cap is not etched through during an etching of the contact regions. In one embodiment, the protective caps may have a thickness between about 30 nm and about 40 nm. Another guideline in choosing a thickness of the protective caps is to avoid a parasitic capacitance on top of the gates, which would slow down transistor performance. As shown in FIG. 2, caps 218a and 218b may be disposed substantially within outer lateral boundaries SB of the first and second spacers of each corresponding gate 202a and 202b In the particular shown embodiments, caps 218a and 218b extend substantially to the outer lateral boundaries SB and are super-adjacent the first and second spacers of each corresponding gate 202a or 202b.

The device 300 of FIG. 3 has like components to the components of device 200 of FIG. 2 in many respects. Thus, similar to FIG. 2, microelectronic device 300 comprises a transistor structure 312 including gates, spacers and a diffusion layer. Transistor structure 312 may thus include a pair of gates 302a and 302b disposed next to one another. Transistor structure 312 further includes a first spacer 305'a and a second spacer 305"a respectively adjacent a first side and a second side of the gate 302a. In addition, transistor structure 312 includes a first spacer 305'b and a second spacer 305"b respectively adjacent a first side and a second side of the gate 302b. Transistor structure 312 may additionally include a diffusion layer 310 supra-adjacent the pair of gates, which diffusion layer 310 may include a source region between the two gates, and drain regions on opposite sides of the gates (not shown). Microelectronic device 300 may further include contact regions 316 super-adjacent the diffusion layer 310. The contact regions 316 may be disposed adjacent the first spacer and the second spacer of each gate as shown. The contact regions may further be disposed adjacent protective caps 318a and 318b, which caps are respectively disposed super-adjacent the gate 302a on the one hand, and 302b on the other hand. The protective caps are adapted to protect the device from shorts between the gate and the contact regions. As such, similar to caps 218a and 218b, the protective caps may, for example, comprise silicon nitride. As shown in FIG. 3, similar to the device 200 of FIG. 2, caps 318a and 318b may be disposed substantially within outer lateral boundaries SB of the first and second spacers of each corresponding gate 302a and 302b. In the particular shown embodiments, caps 318a and 318b extend substantially to the outer lateral boundaries SB and are super-adjacent the first and second spacers of each corresponding gate 302a or 302b.

Although the embodiments of FIGS. 2 and 3 show protective caps that extend substantially to the outer lateral boundaries SB of corresponding spacers, it is to be understood that embodiments are not so limited, and include within their scope the provision of a protective cap that does not extend substantially beyond the outer lateral boundaries SB of the spacers of the corresponding gate, as will be explained further below by way of example with respect to FIGS. 10a-13.

In the shown embodiments, the contact regions are disposed such that, for each gate, a first contact region is adjacent the first spacer on one side of the gate, and a second contact region is adjacent the second spacer on another side of the gate, and further such that the protective cap on each gate is disposed adjacent the first contact region at one side thereof, and the second contact region on the opposite side thereof. Thus, referring to FIG. 2, contact regions 216 may be disposed such that, for gate 202a, a first contact region 216'a is adjacent the first spacer 205'a and adjacent one side of protective cap 218a, and a second contact region 216"a is adjacent the second spacer 205'a and adjacent the opposite side of protective cap 218a. Referring still to FIG. 2, contact regions may be disposed such that, for gate 202b, a first contact region 216'b is adjacent the first spacer 205'b and adjacent one side of protective cap 218b, and a second contact region 216'b is adjacent the second spacer 205"b and adjacent the opposite side of protective cap 218b. Thus, second contact region 216"a of gate 202a physically corresponds to first contact region 216'b of gate 202b. Similarly, in FIG. 3, contact regions 316 may be disposed such that, for gate 302a, a first contact region 316'a is adjacent the first spacer 305'a and adjacent one side of protective cap 318a, and a second contact region 316"a is adjacent the second spacer 305"a and adjacent the opposite side of protective cap 318a. Referring still to FIG. 3, contact regions may be disposed such that, for gate 302b, a first contact region 316'b is adjacent the first spacer 305'b and adjacent one side of protective cap 318b, and a second contact region 316"b is adjacent the second spacer 305"b and adjacent the opposite side of protective cap 318b. Thus, second contact region 316"a of gate 302a physically corresponds to first contact region 316'b of gate 302b The transistor structure 212/312 may be formed using a metal gate process, as would be recognized by one skilled in the art, although embodiments are not restricted to transistors having metal gates formed in any specific fashion. One embodiment of a microelectronic device as shown for example in FIG. 2/FIG. 3, where the diffusion layer 210/310 is formed as an SOI structure, further includes a first ILD oxide layer 220/320 above a buried oxide layer 230/330, which is in turn disposed above a silicon substrate (not shown). An etch stop layer 240/340 is disposed between the ILD oxide layer 220/320 and the buried oxide layer 230/330. The etch stop layer 240/340 may be made, for example, of a nitride material, and is adapted to serve as an etch stop during a patterning of the contact regions, as will be explained in detail further below with respect to FIGS. 8 and 9. A second ILD layer 250/350 is disposed above the first ILD layer 220/320.

Referring now to FIG. 2, a third ILD layer 260 may be disposed above second ILD layer 250. The contact regions 216 include a self-aligned contact (SAC) portions 280 and metal one portions 290 super-adjacent respective ones of the SAC portions 280. Each SAC portion 280 extends to a height substantially equal to a height of each corresponding gate plus protective cap. Thus, SAC portion 280'a of contact region 216'a has a height substantially equal to a height of corresponding gate 202a plus protective cap 218a as shown. Additionally, SAC portion 280"a of contact region 216"a has a height substantially equal to a height of corresponding gate 202a plus protective cap 218a. SAC portion 280'b of contact region 216'b has a height substantially equal to a height of corresponding gate 202b plus protective cap 218b. Contact regions 216"a and 216'b physically correspond to one another. Moreover, SAC portion 280"b of contact region 216"b has a height substantially equal to a height of corresponding gate 202b plus protective cap 218b. The SAC portion may comprise any suitable contact metal, as would be recognized by one skilled in the art. Each contact region 216 further includes a metal one portion 290 super-adjacent corresponding ones of the SAC portions 280 as noted above. The metal one portions 290 as shown in FIG. 2 may be formed by a metal damascene process as will be explained further below. Referring now to FIG. 3, a third ILD layer 360 may be disposed above second ILD layer 350. The contact regions 316 include metal one portions 390 extending from a top of the third ILD layer 250 down to the diffusion layer 310. the contact regions 316 include contact regions 316'a and 316"a at respective sides of gate 202a, and contact regions 316'b and 316"b at respective sides of gate 202b as shown. Referring now to both FIGS. 2 and 3, while FIG. 2 includes SAC portions distinct from metal one portions, the SAC portions and the metal one portions defining a line of demarcation L therebetween, FIG. 3 includes continuous metal one portions 390 from the diffusion layer 310 up to a top of the third ILD layer 250. In addition, the device of FIG. 2 may exhibit a misalignment or offset between the metal one portions and the SAC portions by virtue of the respective portions having been patterned at different times. The latter misalignment would not be seen in the device of FIG. 3.

Figure 8:
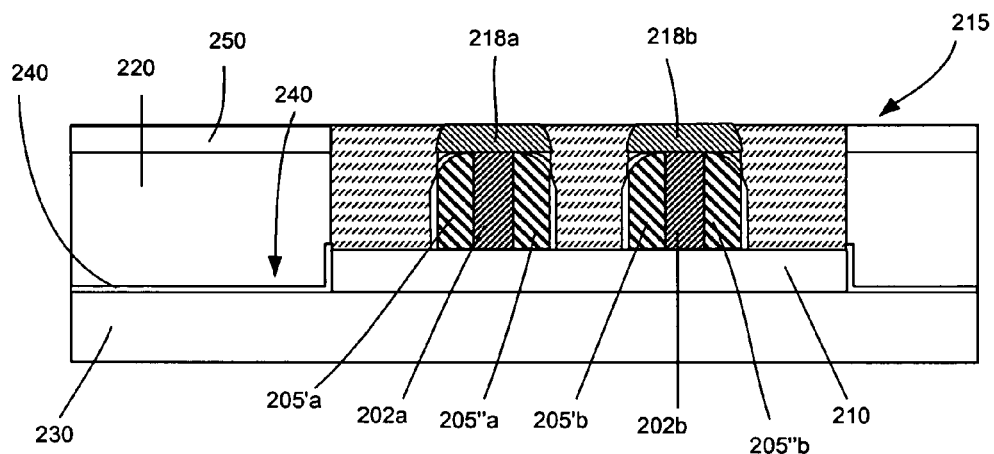
FIG. 8 is a cross-sectional view of the transitional transistor structure of FIG. 7 in a stage of formation into the microelectronic device of FIG. 2.
Figure 9:
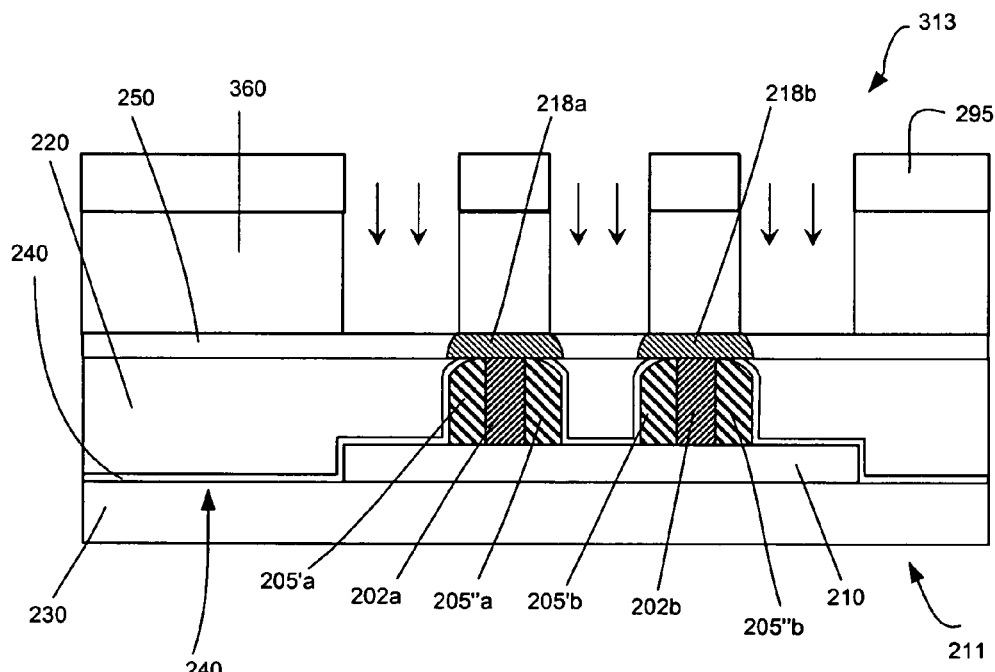
FIG. 9 is a cross-sectional view of the transitional transistor structure of FIG. 7 in a stage of formation into the microelectronic device of FIG. 3.

FIGS. 4-7 illustrate a first embodiment of a transitional transistor structure at different stages of its formation into a microelectronic device such as the microelectronic device of FIG. 2/FIG. 3. FIGS. 8 and 9 respectively show two different embodiments of transitional transistor structures at a particular stage of formation into microelectronic devices of FIGS. 2 and 3, respectively, starting from the transitional transistor structure of FIG. 7.

Although components in FIGS. 4-7 that correspond to like components in FIG. 2 have been designated in FIGS. 4-7 with reference numerals corresponding to the components of FIG. 2, it is to be understood that those same components in FIGS. 4-7 could have equally as well been designated with reference numerals corresponding to the components of FIG. 3. Thus, by way of example, where the buried oxide layer 230 is being referred to in FIGS. 4-7, the buried oxide layer could have been designated equally as well with the reference numeral 330. It is a further processing of the transitional transistor structure of FIG. 7 that results in either the embodiment of FIG. 2 or the embodiment of FIG. 3, depending on the type of processing chosen subsequent to FIG. 7, as will be explained in further detail with respect to FIGS. 8 and 9, respectively.

Figure 4:
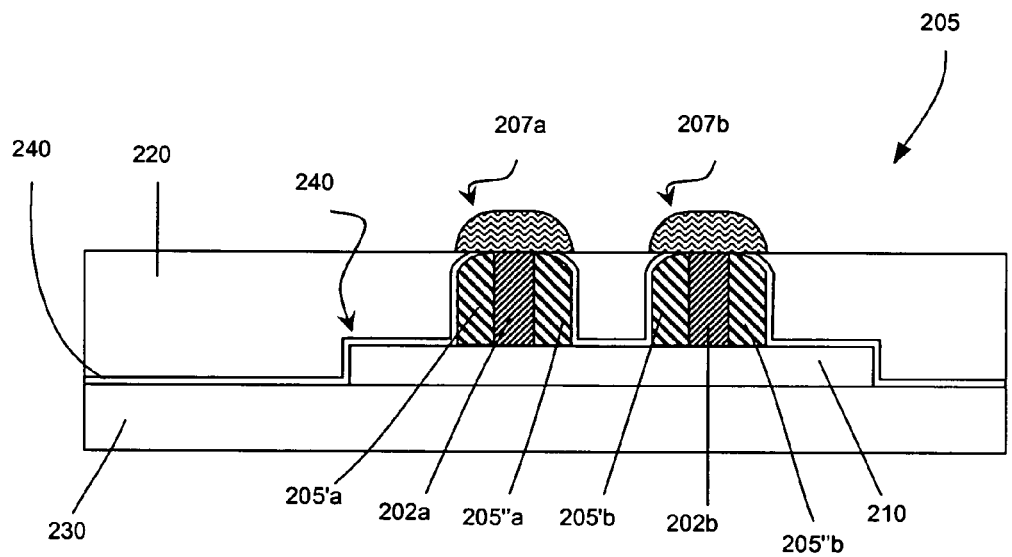
FIGS. 4-7 are cross-sectional views of transitional transistor structures in various stages of formation into a microelectronic device according to one embodiment.

Referring first to FIG. 4, a transitional transistor structure 205 is shown including the buried oxide layer 230, the first ILD layer 220, the diffusion layer 210, transistor structure 212 including gates 202a and 202b, spacers 205'a and 205"a on the one hand, and spacers 205'b and 205"b on the other hand, and a diffusion layer 210. In the shown transitional transistor structure 205, the first ILD layer 220 is shown as encompassing or covering the transistor structure 212. Also partially covering the transistor structure 212 in FIG. 4 is the etch stop layer 240. According to one embodiment, the gates 202a and 202b are metal gates. For a replacement metal gate process, metal gates 202a and 202b may be formed after planarization of the first ILD layer 220. For a subtractive metal gate process, planarization of ILD layer 220 is done after formation of gates 202a and 202b. Spacers 202'a, 202"a, 202'b and 202"b may be made of silicon nitride.

The structure 205 of FIG. 4 further shows sacrificial caps 207a and 207b disposed onto the gates. The sacrificial caps may, according to an embodiment be selectively deposited onto the gates via electroless plating, and may made of one of, for example, Ni or Co. Such materials as listed may be electrolessly deposited onto metal materials such as Cu, Fe, or Mo. It has been observed that a polishing of the tops of gates 202a and 202b during the replacement metal gate forming process typically correlates with a uniformity of deposition of the sacrificial material via electroless deposition. To the extent that an electroless deposition process is typically isotropic, the resulting sacrificial cap for each gate would grow substantially equally vertically and laterally as shown. Care may thus be taken in the provision of the sacrificial caps via electroless deposition that a lateral extent of the sacrificial caps does not extend substantially beyond lateral boundaries of the spacers. One reason for the above is that a protective cap resulting from a sacrificial cap that extends beyond those lateral boundaries may compromise a performance of the microelectronic device among other things by compromising spaces available for the contact regions.

Figure 5:
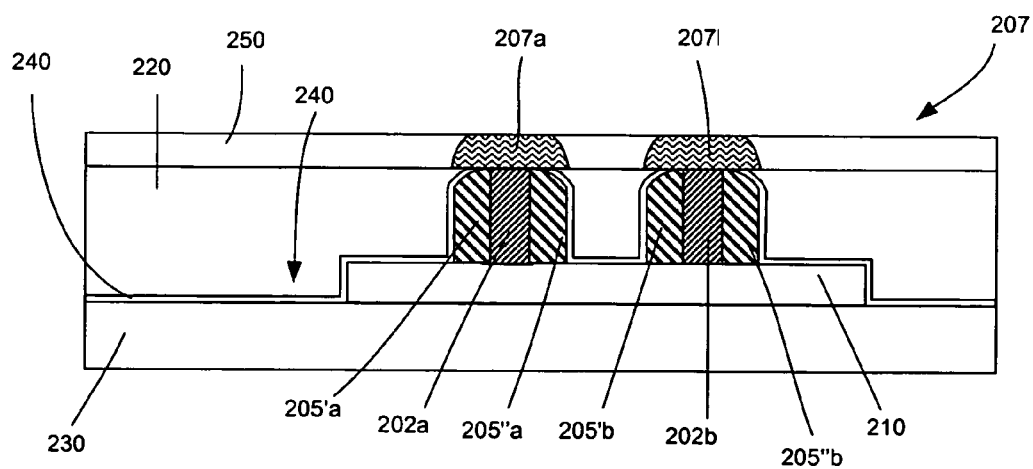

Referring now to FIG. 5 by way of example, a method embodiment comprises providing a second ILD layer, such as second ILD layer 250, encompassing the sacrificial cap, such as sacrificial caps 207a and 207b, super-adjacent the first ILD layer, such as ILD layer 220. Providing the second ILD layer 250 may comprise, according to one embodiment, ILD deposition via chemical vapor deposition, and then polishing the deposited ILD to expose the tops of sacrificial caps 207a and 207b. Provision of the second ILD layer 250 would result in the formation of transitional transistor structure 207 as shown in FIG. 5.

Figure 6:
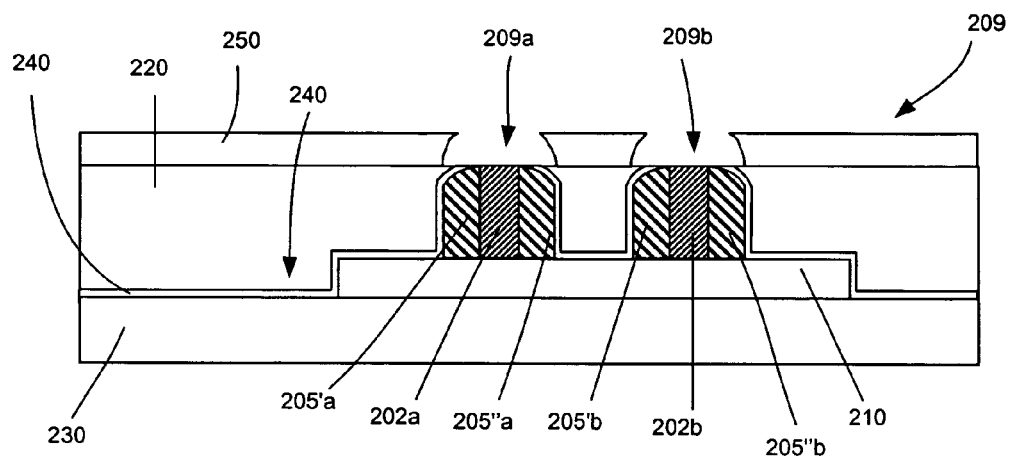

Referring now to FIG. 6 by way of example, a method embodiment comprises defining a protective cap recess, such as recesses 209a and 209b, by removing the sacrificial cap, such as sacrificial caps 207a and 207b, from the second ILD layer, such as ILD layer 250. According to one embodiment, a selective etch may be used to etch away the sacrificial material of caps 209a and 209b without attacking the second ILD layer, the gate material or the spacers about each gate. For example, where the sacrificial material comprises Co, a selective etch using a wet etch may be used to remove the sacrificial caps. A provision of recesses 209a and 209b in the second ILD layer 250 results in the formation of transitional transistor structure 209 as shown in FIG. 6.

Figure 7:
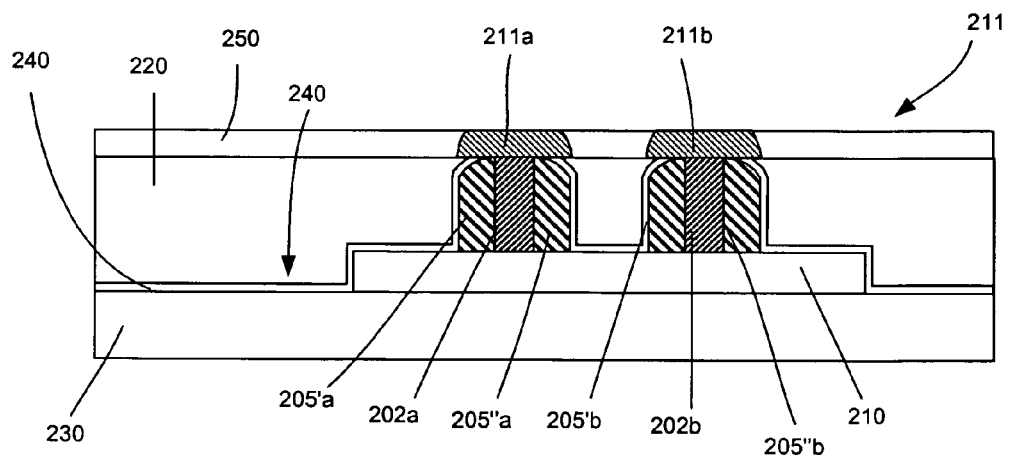

Referring now to FIG. 7 by way of example, a method embodiment comprises forming a protective cap body, such as protective cap bodies 211a and 211b by providing protective material in the protective cap recess, such as in recesses 209a and 209b. The cap bodies 211a and 211b may be formed as follows. A protective material layer, such as, for example, a SiN layer (not shown) may be provided onto the recessed second ILD layer 250 of transitional transistor structure 209 of FIG. 6, and then planarized by polishing a top thereof, or, in the alternative, by using a dry etch on a top surface thereof. The polishing may be performed down to the top of the recesses 209a and 209b to form the protective cap bodies 211a and 211b. Provision of cap bodies 211a and 211b results in the formation of a transitional transistor structure 211 as shown in FIG. 7.

As noted above, FIGS. 8 and 9 respectively show two different embodiments of a transitional transistor structures at a stage of formation into microelectronic devices of FIGS. 2 and 3, respectively, starting from the transitional transistor structure of FIG. 7. FIGS. 8 and 9 will be described seriatim below.

FIG. 8 shows an embodiment of a transitional transistor structure 213 that could be used to ultimately result in the microelectronic device 200 of FIG. 2. In particular, FIG. 8 shows a cross section of a transitional structure after a self-aligned contact (SAC) etch and provision of contact metal into open areas resulting from the SAC etch to form SAC portions, such as SAC portions 280'a, 280"a/280'b and 280"b super-adjacent the diffusion layer 210. The provision of SAC open areas may be done from the top of the transitional structure 211 of FIG. 7. A photoresist layer (not shown) may be applied to the top of structure 211 of FIG. 7, and patterned to create open SAC areas corresponding to SAC regions 280 of FIG. 2. The etch stop layer 240 prevents an etching of the spacers about each gate in a well know manner. After the etch, the photoresist layer may be removed, and contact metal may be deposited into the open SAC areas and planarized to form SAC portions 280'a, 280"a/280'b and 280"b as also shown in FIG. 2. Provision of the SAC regions as shown in FIG. 8 results in the formation of a transitional transistor structure 215.

Referring back now to FIG. 2 by way of example, a method embodiment comprises providing metal one portions, such as metal one portions 290, onto respective ones of the SAC regions. The metal one portions 290 may be provided using a damascene process. Thus, a third ILD layer 260 may be deposited into structure 210 of FIG. 8. A photoresist layer (not shown) may then be patterned onto third ILD layer 260, and the third ILD layer etched based on the photoresist pattern down to the SAC regions 280 to define metal one recesses above respective ones of the SAC regions 280. The photoresist layer is then removed. Thereafter, metal one contact metal may be deposited inside the metal one recesses and planarized to yield the metal one portions 290. Planarization of the deposited metal one contact metal may be achieved either by polishing or by etching.

FIG. 9 shows an embodiment of a transitional transistor structure 313 that could be used to ultimately result in the microelectronic device 300 of FIG. 3. In particular, FIG. 9 shows a cross section of a transitional structure after a metal one etch to form metal one open areas to in turn yield metal one portions 390 directly provided super-adjacent the diffusion layer 310. The provision of metal one open areas may be performed from the top of the transitional structure 211 of FIG. 7. Thus, according to one embodiment, third ILD layer 360 may be deposited onto second ILD layer 350. Thereafter, a photoresist layer 395 may be applied to the top of third ILD layer 360, and patterned to create open metal one areas corresponding to metal one portions 390 of FIG. 3. Etch stop layer 340 stops an etching of the spacers about each gate. Provision of the metal one open areas as shown in FIG. 9 results in the formation of a transitional transistor structure 313.

Referring back now to FIG. 3 by way of example, a method embodiment comprises providing metal one portions, such as metal one portions 390, directly onto the diffusion layer 310. After the etch, the photoresist layer may be removed, and contact metal may be deposited into the open metal one areas directly onto the diffusion layer 310, and planarized to form metal one portions 390 as also shown in FIG. 3. Planarization of the deposited metal one contact metal may be achieved either by polishing or by etching.

While FIGS. 4-9 show the provision of a protective cap using an electroless deposition of a sacrificial cap onto the gate, according to embodiments, the protective cap may be provided onto a transitional transistor structure, such as structure 205, in any manner. For example, as shown in FIGS. 10a-13 by way of example, the protective cap may be provided by way of example using a carbon nano-tube (CNT) deposition of a sacrificial cap super-adjacent the gate. Optionally, as will be explained with respect to FIG. 10b, CNT deposition may be used to provide a sacrificial central body, which may then be provided with sacrificial spacers on sides thereof to form the sacrificial cap.

Figure 10A:
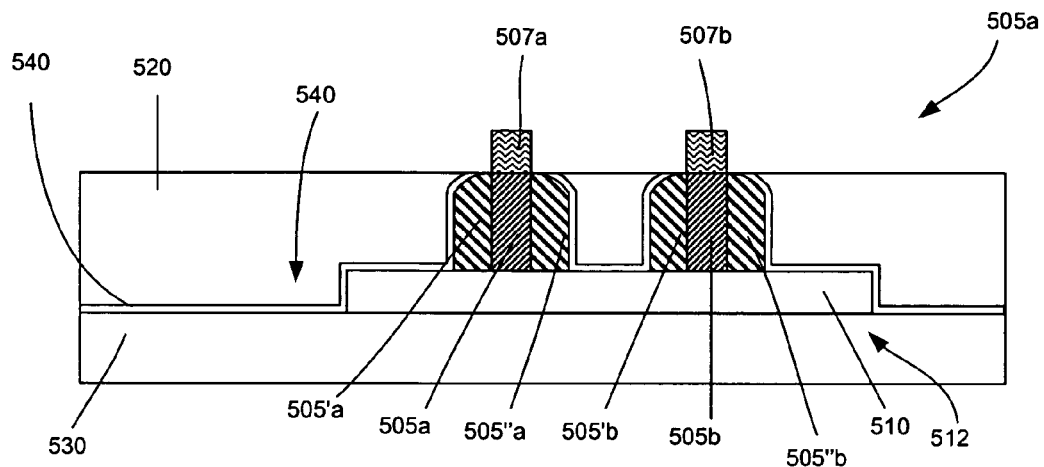
FIGS. 10a and 10b are cross-sectional views of two respective transitional transistor structures according to two different embodiments.

Referring now to FIG. 10a, which is similar in most respects to FIG. 4 except for the shape of its sacrificial caps, a transitional transistor structure 505a including buried oxide layer 530, first ILD layer 520, diffusion layer 210, and transistor structure 512 including gates 502a and 502b, spacers 505'a and 505"a on the one hand, and spacers 505'b and 505"b on the other hand are shown. In the shown transitional transistor structure 505a, the first ILD layer 520 encompasses or covers the transistor structure 512. Also partially covering the transistor structure 512 in FIG. 10a is the etch stop layer 540. According to one embodiment, the gates 502a and 502b are metal gates.

The structure 505a of FIG. 10a further show sacrificial caps 507a and 507b disposed onto the gates. The sacrificial caps may, according to an embodiment, be selectively deposited onto the gates via either CNT or selective plasma deposition via CVD, as shown in FIG. 10a. Unlike electroless deposition as outlined with respect to FIGS. 4-9 above, both CNT and selective plasma deposition achieve a characteristic columnar structure by virtue of not being isotropic. A choice between electroless deposition as described above with respect to FIGS. 4-9 above, CNT, and selective plasma deposition (hereinafter "SPD") may be dictated by a number of factors. For example, electroless deposition may be suitable in applications where the design rule allows for a lesser degree of control of the transistor component dimensions (thus a less stringent design rule) by virtue of the isotropic growth of the electrolessly deposited material. Electroless deposition may further be attractive in applications where low temperature processing is desired. On the other hand, both CNT and SPD would be more suitable in applications where design is more stringent, with CNT allowing for a tighter control of protective cap dimensions than would SPD. However, while CNT would pose a thermal budget issue by virtue of requiring relatively higher processing temperatures, SPD is achievable in relatively lower temperatures.

CNT deposition may be achieved on metal materials such as Cu, Fe, Mo or Al as the gate materials. As seen in FIG. 10a, both CNT and SPD deposition lead to a localized deposition of sacrificial material super-adjacent only the gates 502a and 502b, and thus vertically upward without lateral growth. Optionally, a Co or Ni seed layer may be electrolessly deposited onto the tops of the gates 502a and 502b before CNT deposition. The CNT method of providing the sacrificial caps may be used, for example, on gates having gate lengths below 100 nm, such as, for example, gate lengths from about 20 nm to about 60 nm. With respect to SPD, blanket deposition may be effected onto both the gates and the surrounding oxide with a higher deposition rate occurring on the metal as opposed to on the surrounding oxide. The above blanket deposition, along with a concurrent etching away of the deposit on the oxide, achieves a provision of the deposited material only on the gates.

Figure 10B:
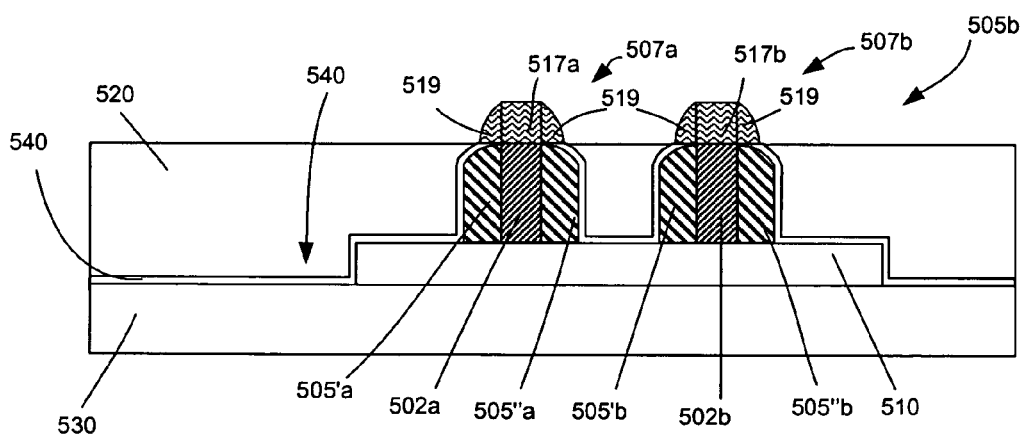

Referring now to FIG. 10b by way of example, a method embodiment includes forming a sacrificial cap body, such as cap bodies 517a and 517b of FIG. 10b, and providing sacrificial spacers, such as spacers 519 on each side of each sacrificial cap body, to form the sacrificial caps 507a and 507b. Provision of the sacrificial bodies 517a and 517b may be effected according to an embodiment in the manner described with respect to FIG. 10a, where bodies 517a and 517b may be provided by way of CNT or selective plasma deposition. Provision of sacrificial spacers 519 may be effected to impart some lateral extent to the sacrificial caps resulting therefrom, and thus a lateral extent to the protective caps resulting from the provision of the sacrificial caps in order to improve gate protection. The spacers 519 may, for example, be provided by first depositing a layer of sacrificial material (not shown) to encompass the sacrificial central bodies 517a and 517b, and thereafter by anisotropically etching the layer of sacrificial material to obtain the spacers 519.

Figure 11:
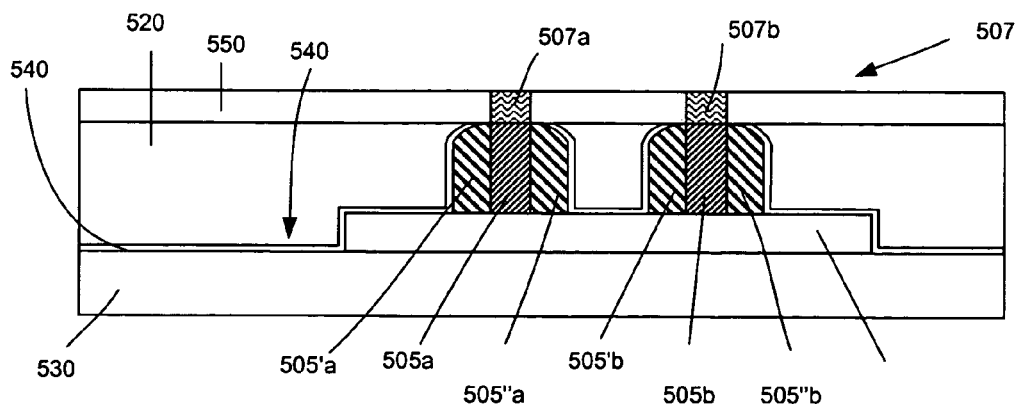
FIGS. 11-13 are cross-sectional views of transitional transistor structures in various stages of formation into a microelectronic device according to an alternate embodiment.
Figure 12:
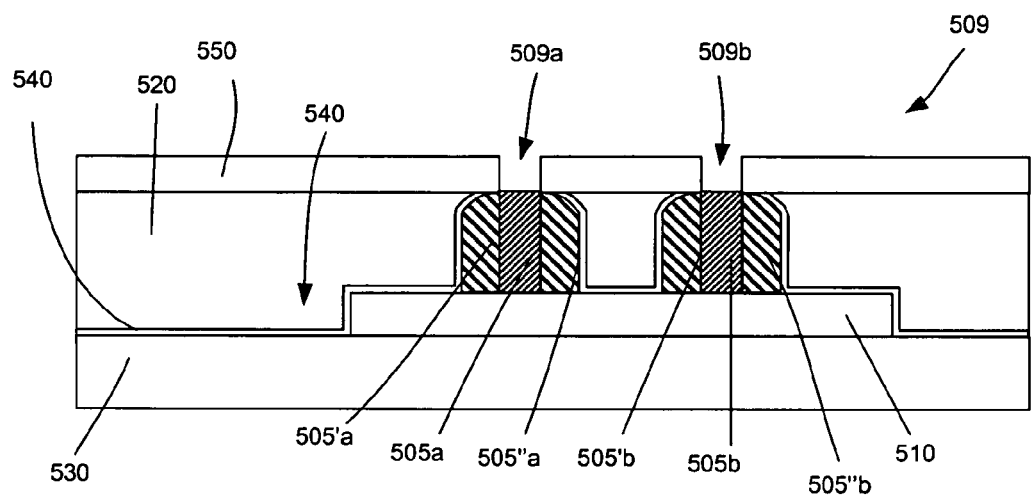
Figure 13:
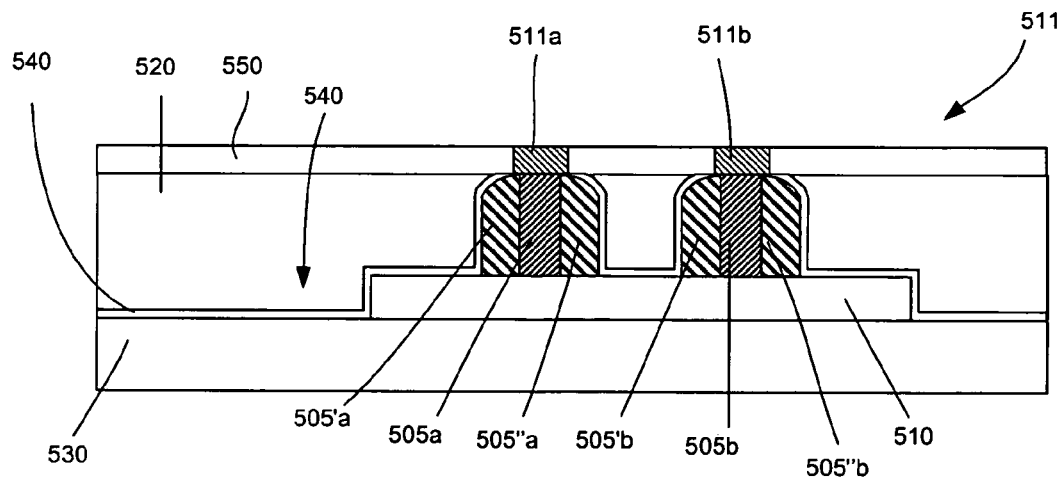

FIGS. 11-13 will now be described below with respect to a further processing of the transitional transistor structure 505a of FIG. 10a. However, it is to be understood that the processing described in relation to FIGS. 11-13 could equally as well, according to an embodiment, be applied to the transitional transistor structure 505b of FIG. 10b.

Referring now to FIG. 11 by way of example, a method embodiment comprises providing a second ILD layer, such as second ILD layer 550, encompassing the sacrificial cap, such as sacrificial caps 507a and 507b, super-adjacent the first ILD layer, such as ILD layer 520. Providing the second ILD layer 550 may comprise, according to one embodiment, ILD deposition via CVD, and then polishing the deposited ILD to expose the tops of sacrificial caps 507a and 507b. Provision of the second ILD layer 550 would result in the formation of transitional transistor structure 507.as shown in FIG. 11.

Referring now to FIG. 12 by way of example, a method embodiment comprises defining a protective cap recess, such as recesses 509a and 509b, by removing the sacrificial cap, such as sacrificial caps 507a and 507b, from the second ILD layer, such as ILD layer 550. According to one embodiment, a selective etch may be used to etch away the sacrificial material of caps 509a and 509b without attacking the second ILD layer, the gate material or the spacers about each gate. For example, oxygen plasma etching can selectively etch the sacrificial CNT material without substantially attacking the ILD layer. A provision of recesses 509a and 509b in the second ILD layer 550 results in the formation of transitional transistor structure 509 as shown in FIG. 12. Optionally, the recesses 509a and 509b may be expanded in their extent through a further etching of the second ILD layer 550, mainly in order to impart some lateral extent to the sacrificial caps resulting therefrom, and thus a lateral extent to the protective caps resulting from the provision of the sacrificial caps in order to improve gate protection. Doing so may, however, reduce a thickness of the sacrificial cap recesses and thus of the resulting protective caps, and a choice as to whether an expansion of those recesses should be performed should be made with the above issue in mind.

Referring now to FIG. 13 by way of example, a method embodiment comprises forming a protective cap body, such as protective cap bodies 511a and 511b by providing protective material in the protective cap recess, such as in recesses 509a and 509b. The cap bodies 511a and 511b may be formed as follows. A protective material layer, such as, for example, a SiN layer (not shown) may be provided onto the recessed second ILD layer 550 of transitional transistor structure 509 of FIG. 12, and then planarized by polishing a top thereof, or, in the alternative, by using a dry etch on a top surface thereof. The polishing may be performed down to the top of the recesses 509a and 509b to form the protective cap bodies 511a and 511b. Provision of cap bodies 511a and 511b results in the formation of a transitional transistor structure 511 as shown in FIG. 13.

Structure 511 of FIG. 13 may then be processed similarly to the processing shown in FIG. 8 or 9 in order to yield microelectronic devices having SAC regions as shown in FIG. 2, or having metal one portions extending directly to the diffusion layer as shown in FIG. 3, with the difference that the sacrificial cap would have been deposited at least in part using CNT deposition.

Advantageously, because metal gates according to embodiments are protected by respective protective caps which extend above the gates and associated spacers, the necessity of using any additional contact layers, such as additional contact layers disposed in an additional ILD layer between SAC regions and metal one portions is obviated. Also, advantageously, the provision of protective caps according to embodiments allows the formation of metal one portions directly above the diffusion layer without the necessity and the expense of providing SAC regions in the first instance. In addition, because, according to embodiments, the protective gates reside above the gates, prior art problems associated with controlling gate height while achieving gate protection are obviated.

Figure 14:
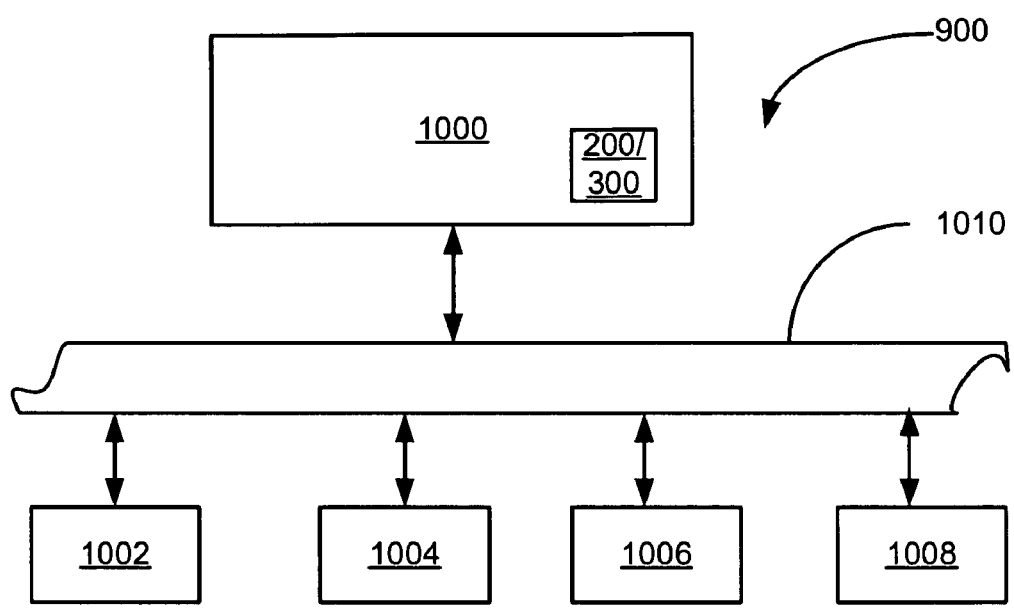
FIG. 14 is a schematic view of a system embodiment incorporating a microelectronic device formed according embodiments.

Referring to FIG. 14, there is illustrated one of many possible systems 900 in which embodiments of the present invention may be used. In one embodiment, the electronic assembly 1000 may include a microelectronic device, such as device 200 or device 300 of FIG. 2 or 3, respectively. Assembly 1000 may further include a microprocessor. In an alternate embodiment, the electronic assembly 1000 may include an application specific IC (ASIC). Integrated circuits found in chipsets (e.g., graphics, sound, and control chipsets) may also be packaged in accordance with embodiments of this invention.

For the embodiment depicted by FIG. 14, the system 900 may also include a main memory 1002, a graphics processor 1004, a mass storage device 1006, and/or an input/output module 1008 coupled to each other by way of a bus 1010, as shown. Examples of the memory 1002 include but are not limited to static random access memory (SRAM) and dynamic random access memory (DRAM). Examples of the mass storage device 1006 include but are not limited to a hard disk drive, a compact disk drive (CD), a digital versatile disk drive (DVD), and so forth. Examples of the input/output module 1008 include but are not limited to a keyboard, cursor control arrangements, a display, a network interface, and so forth. Examples of the bus 1010 include but are not limited to a peripheral control interface (PCI) bus, and Industry Standard Architecture (ISA) bus, and so forth. In various embodiments, the system 90 may be a wireless mobile phone, a personal digital assistant, a pocket PC, a tablet PC, a notebook PC, a desktop computer, a set-top box, a media-center PC, a DVD player, and a server.

The various embodiments described above have been presented by way of example and not by way of limitation. Thus, for example, while embodiments disclosed herein teach the formation of protective caps using sacrificial caps, other methods of providing the protective caps are also within the scope of embodiments.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A method of making a microelectronic device comprising:
   providing a transistor structure including a transistor gate, a diffusion layer supra-adjacent the gate, a first spacer adjacent one side of the gate and a second spacer adjacent another side of the gate;
   providing a protective cap super-adjacent the gate;
   providing contact regions super-adjacent the diffusion layer, the contact regions including a first contact region adjacent the first spacer and one side of the protective cap, and a second contact region adjacent the second spacer and an opposite side of the protective cap; and
   a first ILD layer encompassing the gate, the first spacer and the second spacer, and wherein providing a protective cap comprises:
      providing a sacrificial cap onto the gate;
      providing a second ILD layer encompassing the sacrificial cap super-adjacent the first ILD layer,
      defining a protective cap recess by removing the sacrificial cap from the second ILD layer,
      forming a protective cap body by providing a protective material in the protective cap recess;
      removing portions of the second ILD layer to provide the protective cap.

2. The method of claim 1, wherein the protective cap comprises silicon nitride.

3. The method of claim 1, wherein the sacrificial cap comprises a metal material, and wherein providing the sacrificial cap comprises selectively depositing sacrificial cap material by electrolessly plating the sacrificial cap material onto the gate.

4. The method of claim 1, wherein providing the sacrificial cap comprises selectively depositing sacrificial cap material by carbon nano-tube depositing the sacrificial cap material onto the gate.

5. The method of claim 1, wherein the protective cap is disposed substantially within outer lateral boundaries of the first and second spacers.

6. The method of claim 5, wherein the protective cap extends substantially to the outer lateral boundaries of the first and second spacers and is super-adjacent the first and second spacers.

7. The method of claim 5, wherein the protective cap is disposed substantially within outer lateral boundaries of the gate.

8. The method of claim 1, wherein removing comprises removing the sacrificial cap to define an intermediate recess, defining the protective cap recess further comprising removing portions of walls of the intermediate recess.

9. The method of claim 1, wherein providing a sacrificial cap comprises selectively depositing sacrificial cap material onto the gate to form a sacrificial central body, and providing sacrificial spacers on each side of the sacrificial central body to form the sacrificial cap.

10. The method of claim 9, wherein providing sacrificial spacers comprises:
    providing a layer of sacrificial material to encompass the sacrificial central body, and anisotropically etching the layer of sacrificial material to obtain the sacrificial spacers.

11. The method of claim 1, wherein the sacrificial cap comprises a metal.

12. The method of claim 1, wherein the protective cap comprises silicon nitride.

13. The method of claim 1, wherein removing the sacrificial cap comprises etching.

14. The method of claim 1, wherein removing portions of the second ILD layer comprises etching.

15. The method of claim 1, wherein providing contact regions includes:
    providing self-aligned contact regions super-adjacent the diffusion layer and including a first self-aligned contact region adjacent the first spacer and a second self-aligned contact region adjacent the second spacer, and
    providing metal one portions super-adjacent respective ones of the self-aligned contact regions.

16. The method of claim 15, wherein providing self-aligned contact regions comprises:
    patterning a photoresist onto the second ILD layer;
    etching the first ILD layer and the second ILD layer to the diffusion layer to define self-aligned contact recesses encompassing the gate, the first spacer and the second spacer,
    depositing contact metal within the self-aligned contact recesses to define the self-aligned contact regions.

17. The method of claim 15, wherein providing metal one portions comprises:
    depositing a third ILD layer onto the self aligned contact regions;
    patterning a photoresist onto the third ILD layer;
    etching the third ILD layer to the self aligned contact regions to define metal line recesses above the self-aligned contact regions;
    providing metal one portions within respective ones of the metal one portions recesses to define the metal one portions.

18. The method of claim 1, wherein providing contact regions includes directly patterning metal one portions super-adjacent the diffusion layer.

19. The method of claim 18, wherein directly patterning includes:
    depositing a third ILD layer onto the second ILD layer;
    patterning a photoresist onto the third ILD layer;
    etching the first ILD layer, the second ILD layer and the third ILD layer to the diffusion layer to define metal line recesses encompassing the gate, the first spacer, the second spacer and the protective cap;
    depositing contact metal within the metal line recesses to define the contact regions.

* * * * *